US006485654B1

United States Patent
Liu et al.

(10) Patent No.: US 6,485,654 B1
(45) Date of Patent: Nov. 26, 2002

(54) METHOD OF FABRICATING SELF-ALIGNED CONTACTS

(75) Inventors: Meng-Chang Liu, Chia-yi (TW); Shea-Jue Wang, Taipei (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 119 days.

(21) Appl. No.: 09/672,548

(22) Filed: Sep. 28, 2000

(51) Int. Cl.[7] .............................................. H01L 21/302
(52) U.S. Cl. ............................ 216/13; 216/18; 216/41; 216/79; 438/720; 438/723; 438/724; 438/947; 438/597
(58) Field of Search .............................. 216/13, 18, 41, 216/79; 438/720, 723, 724, 947

(56) References Cited

U.S. PATENT DOCUMENTS 5,496,750 A * 3/1996 Moslehi ...................... 438/297
5,966,600 A * 10/1999 Hong .......................... 438/253
6,093,627 A * 7/2000 Sung .......................... 438/586
6,274,425 B1 * 8/2001 Park ........................... 438/241
6,274,441 B1 * 8/2001 Mandelman et al. ....... 438/286

OTHER PUBLICATIONS

Wolf et al, "Silicon Processing For The VLSI ERA" vol. 1, 1986, pp. 168–169.*

* cited by examiner

Primary Examiner—Robert Kunemund
Assistant Examiner—Shamim Ahmed
(74) Attorney, Agent, or Firm—J. C. Patents

(57) ABSTRACT

A process for producing a self-aligned contact comprises the steps of forming leads on a substrate, forming an etching stop layer on the leads by depositing, then forming a sacrificed oxide layer; after the structure of the leads is defined, a spacer is formed on both sides of the structure; a sacrificed oxide layer is formed, allowing the spacer to protrude in the form of horn. Next, a dielectric layer having a flat upper surface is deposited on the substrate and the structure of leads, a contact hole being formed between the leads so as to connect the substrate, a conductive material being filled in the contact hole to form a plug.

20 Claims, 5 Drawing Sheets

METHOD OF FABRICATING SELF-ALIGNED CONTACTS

BACKGROUND OF THE INVENTION

1. Field of the Invention

The present invention relates to a method of fabricating a DRAM. More particularly, the invention relates to a method of fabricating self-aligned contacts between conductor lines.

2. Description of the Prior Art

A process of producing the DRAM main purpose of self-alignment is that the isolation effect for the isolating layer being not reduced due to subsequent etching steps.

FIGS. 1A to 1B show cross-sectional views of a process for producing a non self-aligned contact.

Referring to FIG. 1A, a process for producing a non self-aligned contact includes forming conductor lines 102 on a substrate 100, depositing a dielectric layer 104 having a flat upper surface on the substrate 100 and conductor line 102; then defining a contact hole 106 into the dielectric layer 104 between two conductor lines 102 by etching so as to expose and connect the substrate 100.

Next, referring to FIG. 1B, an isolating spacer 108 is formed on the sidewall of the contact holes 106. Finally, a conductive material is deposited to form a conductive plug 110.

With increasing integrity, the distance between the conductor lines is shortened. In the above mentioned process for producing contacts, it may result in exposure of the conductor lines to the contact hole because of non self-alignment when a dielectric layer is etched to form contact holes.

Two processes for producing a self-aligned contact to improve the disadvantages caused from the above method are known in the art. One of them is showed in FIGS. 2A–2C, the other in FIGS. 2A, 2D–2F.

Referring to FIG. 2A, a general process for producing a self-aligned contact includes forming conductor lines 202 on a substrate 200, depositing a cap layer 204 on the leads 202, then forming an isolating layer 206 on the substrate 200 and cap layer 204.

Next, referring to FIG. 2B, etching is carried out so as to allow the cap layer 204 to be exposed, and an isolating spacer 206a is formed on both sidewalls of the conductor line 202.

Finally, referring to FIG. 2C, a dielectric layer 208 with a flat upper surface is deposited on the substrate 200 and cap layer 204. A contact hole which will be connected with the substrate 200 is defined between two conductor lines 202 and formed by etching part of the dielectric layer 208. Finally, a conductive material is deposited in the contact hole to form a conductive plug 212.

With the process for producing a contact, a part of the cap layer and spacer will be etched off to be thinner. It will result in the poor isolation characteristics between conductor lines and plugs.

Referring to FIG. 2A, another process for producing self-aligned contact is disclosed. Conductor lines 202 are patterned on a substrate 202. A cap layer 204 is deposited on the leads 202. Then, an isolating layer 206 is deposited on the cap layer 204 and substrate 200.

Referring to FIG. 2E, a contact hole 210 which will be connected with the substrate 200 is defined between two conductor lines 202 and formed by etching a part of the dielectric layer 208.

Referring to FIG. 2F, a conductive material is deposited in the contact hole to form a conductive plug 212.

When the dielectric layer was etched by this method, the isolating layer in the bottom of the contact hole will be etched together with the dielectric layer. The bottom of contact hole will have residues if existing non-complete etching on bottom isolating layer. It will result in increased resistance of the contact between the contact hole and the substrate.

SUMMARY OF THE INVENTION

The invention thus provides a process for producing a self-aligned contact, which improves the disadvantages of the prior art, such as poor isolating characteristics between contact holes and conductor lines and non complete etching on the bottom area between the contact hole and substrate.

The process according to the present invention comprises the steps of forming conductor lines on a substrate, forming an etching stop layer on the conductor lines by depositing, then forming a sacrificed oxide layer, after the structure of the conductor lines is defined, forming a spacer on each side of the structure, removing the sacrificed oxide layer, allowing the spacer to protrude in the form of horn. Next, a dielectric layer having a flat upper surface is deposited on the substrate and the conductor lines, a contact hole being formed between the structure of the conductor lines so as to connect the substrate, and a conductive material then being filled in the contact hole and back-etched to form a plug.

The main advantage of the present invention is that: with the structure of spacer, a stack structure of a conductor line layer, an etching stop layer and a sacrificed oxide layer, the spacer subsequently formed is pulled up, then protruding in the form of horn by removing the sacrificed oxide layer.

Because the etchant with higher etching selectivity for the dielectric layer to silicon nitride is used during forming the contact hole by removing part of the dielectric layer, the tip of the horn-shaped silicon nitride spacer is etched less. It can avoid the spacer at the top outside the structure of conductor lines to be etched off to cause the problem of poor isolating characteristics and exposure of conductor lines.

Additionally, according to the present invention, the spacer is very important during forming the contact hole by removing the dielectric layer. It can, improve the isolation between the conductor lines and the conductive plug. Furthermore, the problem of non-complete etching of the dielectric layer in the bottom of the contact can be also improved.

Another advantage of the present invention is to improve the process window. Because the spacer can not be etched readily during forming the contact hole by etching the dielectric layer, the limit to the time of etching has a broader range, achieving an improvable process window.

There is lower contact resistance between the contact hole and the substrate, because the contact area between the contact hole and substrate is etched more completely.

BRIEF DESCRIPTION OF THE DRAWINGS

The above and other purposes, characteristics and advantages of the present invention will be apparent to understand through the detail discussion of the embodiments and the appended drawings, which are.

DETAILED DESCRIPTION OF PREFERRED EMBODIMENTS

FIGS. 3 to 8 show cross-sectional views of a process for producing a self-aligned contact according to one of the embodiments of the present invention.

Figure 1A:
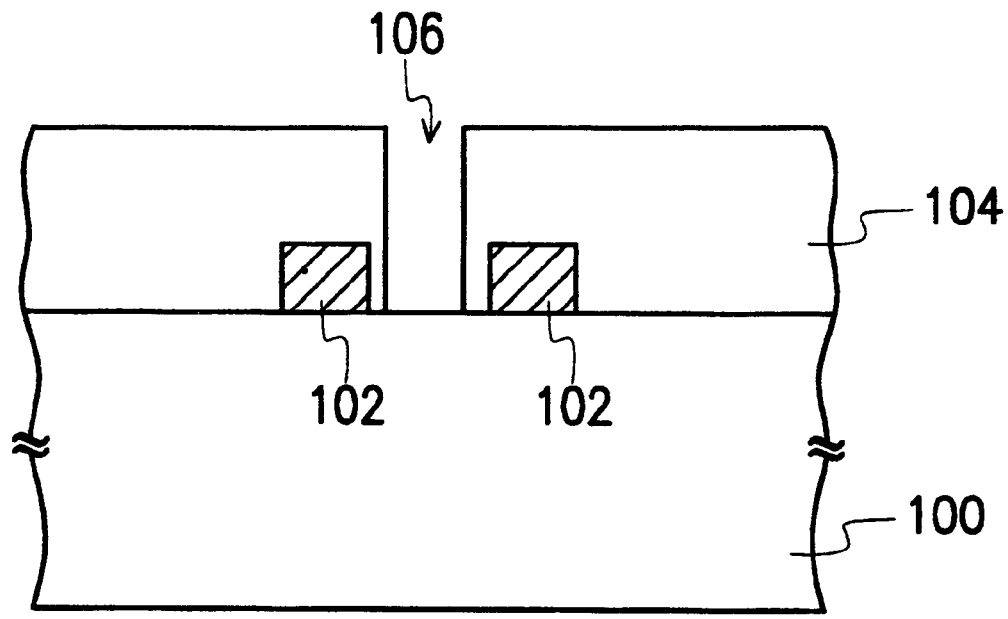
FIGS. 1A to 1B show cross-sectional views of a conventional process for producing a non self-aligned contact.
Figure 1B:
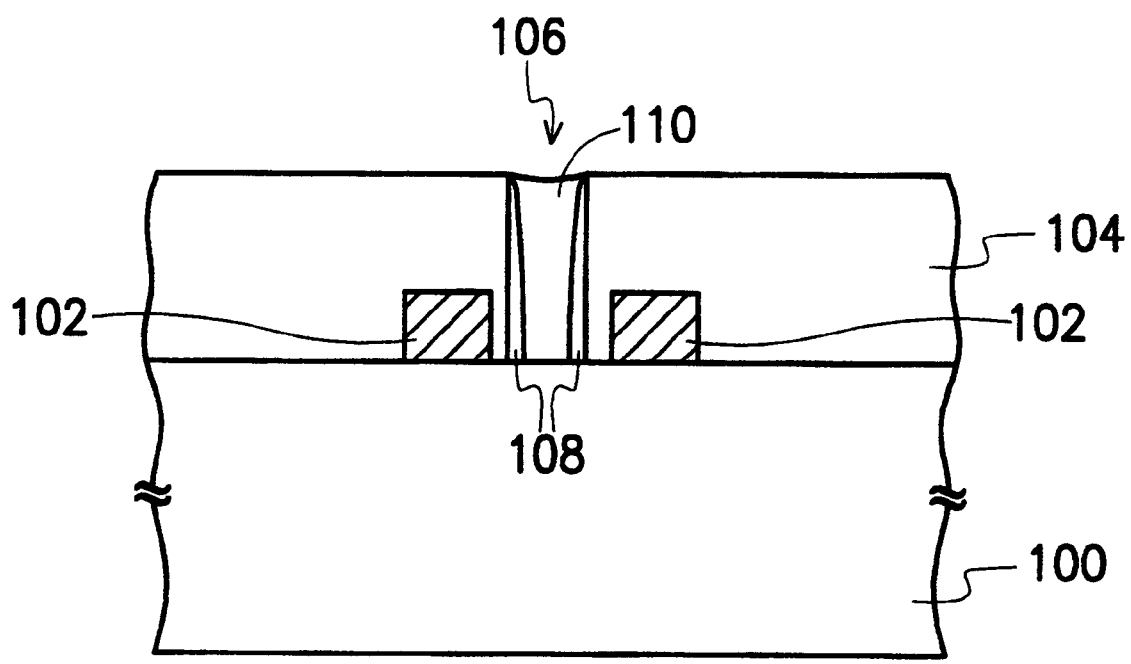
Figure 2A:
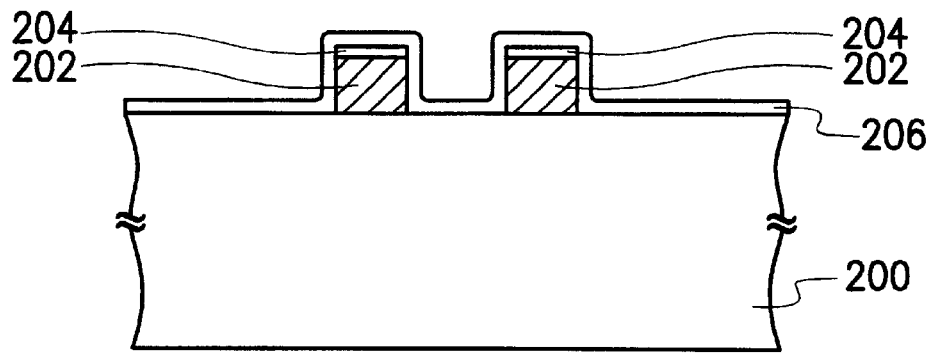
FIGS. 2A to 2F show cross-sectional views of a conventional process for producing a self-aligned contact.
Figure 2B:
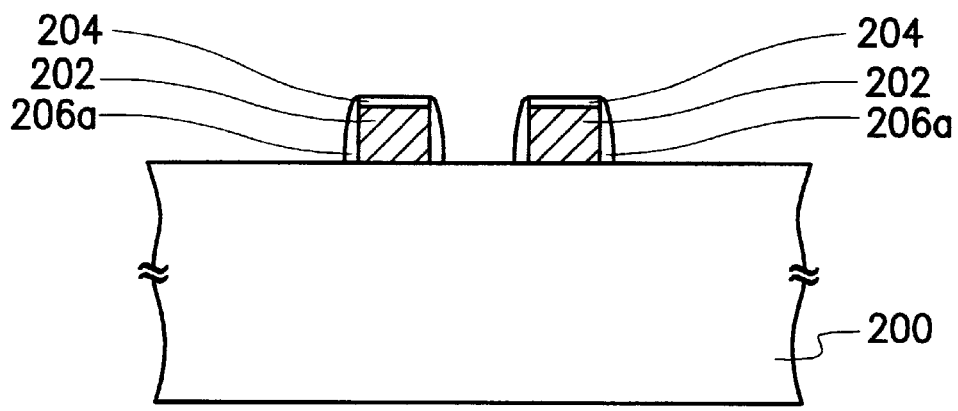
Figure 2C:
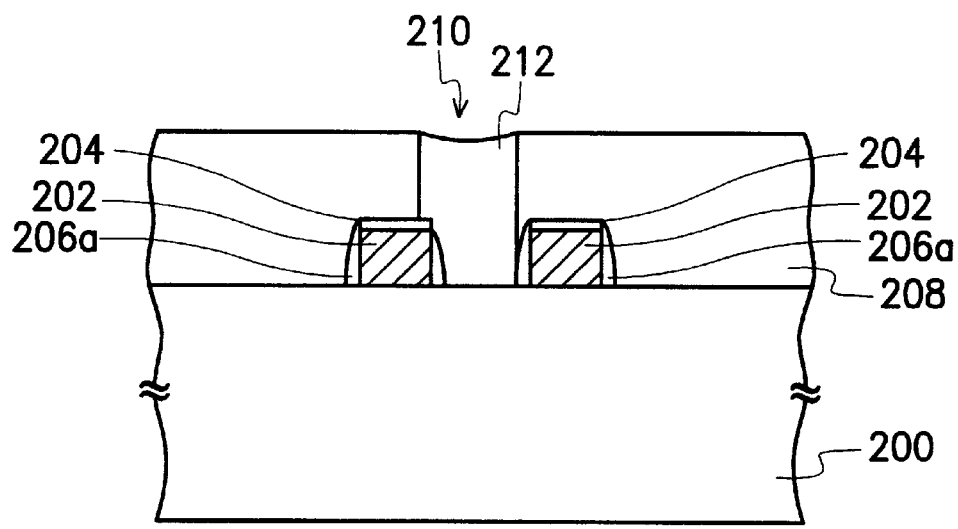
Figure 2D:
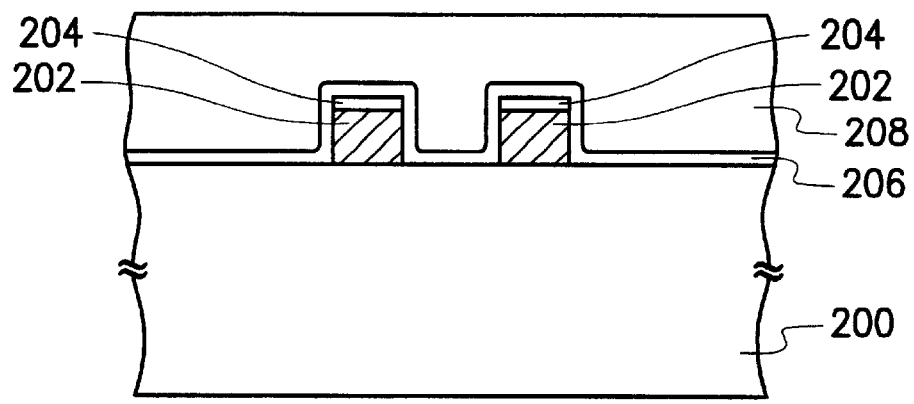
Figure 2E:
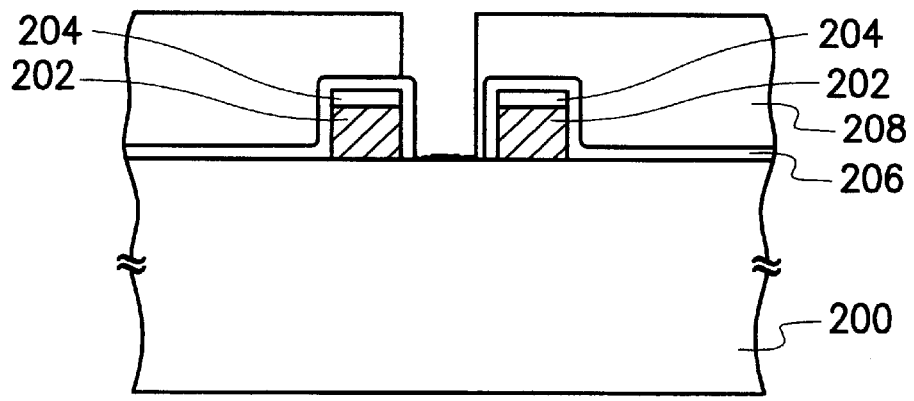
Figure 2F:
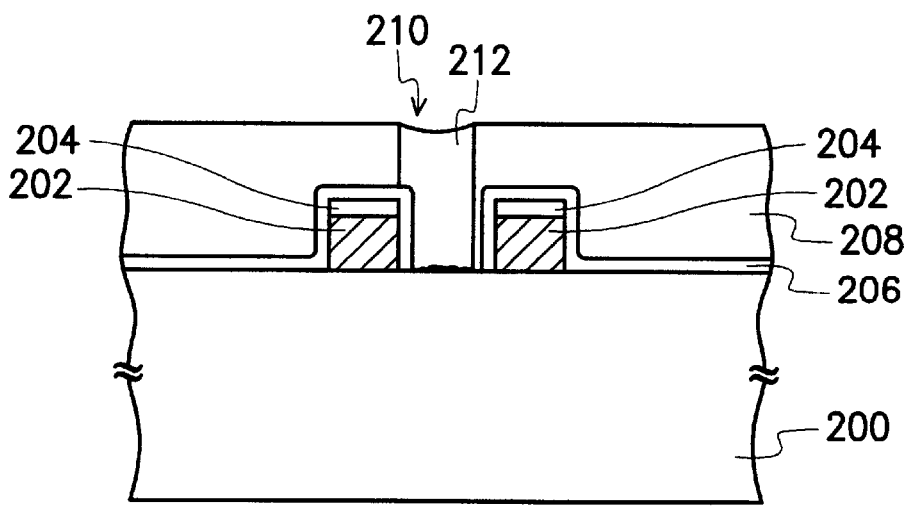
Figure 3:
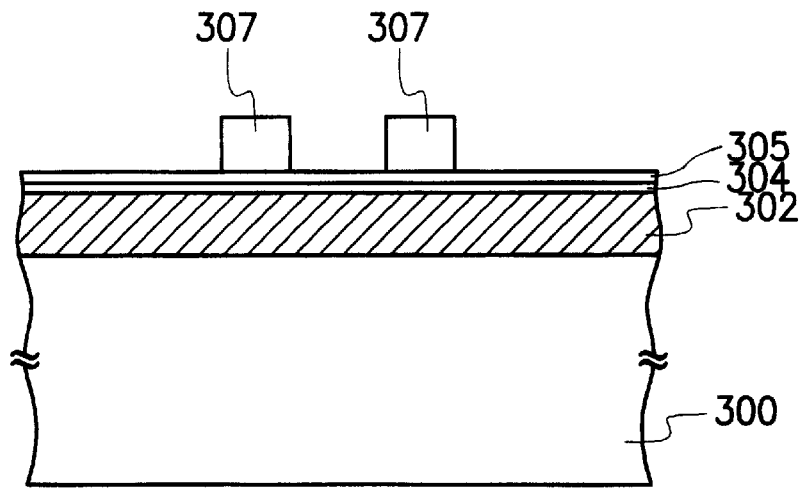
FIGS. 3 to 8 show cross-sectional views of a process for producing a self-aligned contact according to a preferred embodiment of the present invention.
Figure 4:
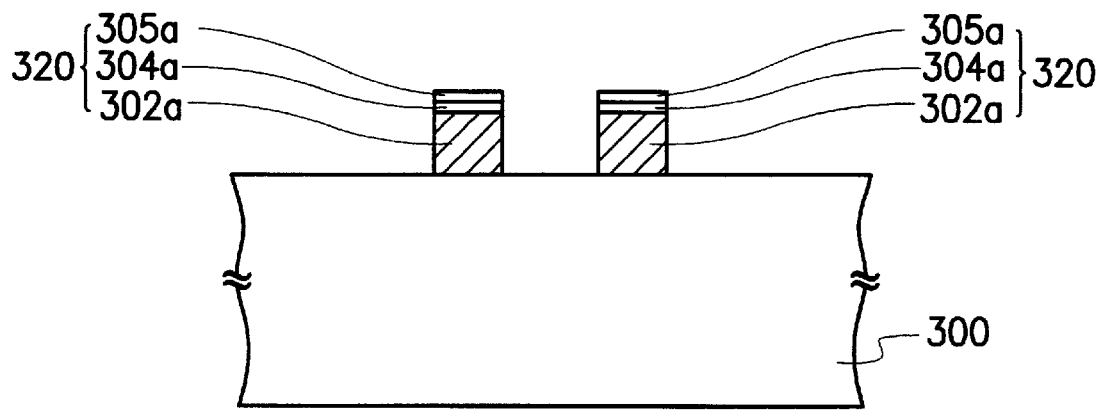

Referring to FIG. 3, a conductive layer 302 is deposited on the substrate 300. Then, an etching stop layer 304 is deposited on the conductive layer 302. Subsequently, a sacrificed oxide layer 305 is deposited on the etching stop layer 304. Referring to FIG. 4, a stack structure 320 is thus deposited by using the photoresist 307 as a masks Then, the positions of the conductor lines 302a are defined by photoresist 307. The stack structure 320 includes the conductive layer 302a, the etching stop layer 304a and the sacrificed oxide layer 305a.

The examples of the preferred materials for forming such conductive layer 302 are metal, or polycrystal tungsten silicide. The example of the preferred materials for forming such etching stop layer 304 is silicon nitride, for example, of about 300~2000 angstrom in thickness by means of such as LP-CVD, PE-CVD or HDP-CVD. The formation of a sacrificed oxide layer 305 on the etching stop layer 304 is achieved by a method such as LP-CVD or PE-CVD with silicon dioxides of such as TEOS. The sacrificed oxide layer 305 has thickness of about 200~1000 angstrom.

After the structures of the conductor lines 302a are defined, referring to FIG. 4, the areas not protected by photoresist 307 are removed by etching to expose the substrate 300.

Figure 5:
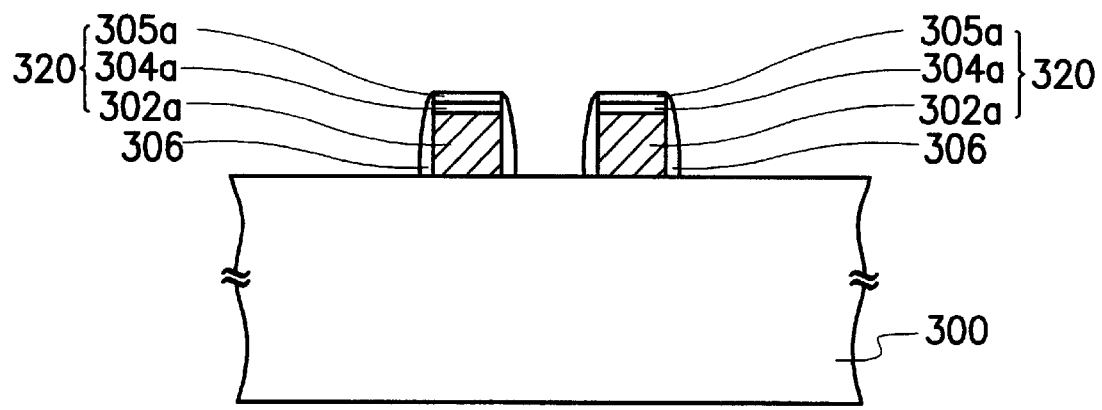

Referring to FIG. 5, an isolating layer is conformally formed on the stack structure 320 and the substrate 300. The isolating layer is etched so as to expose the stack structure 320, thereby forming a spacer 306 on sidewall of the structure.

The above mentioned isolating layer is achieved by a method such as LP-CVD. The examples of etching include general etching and sputter etching.

Figure 6:
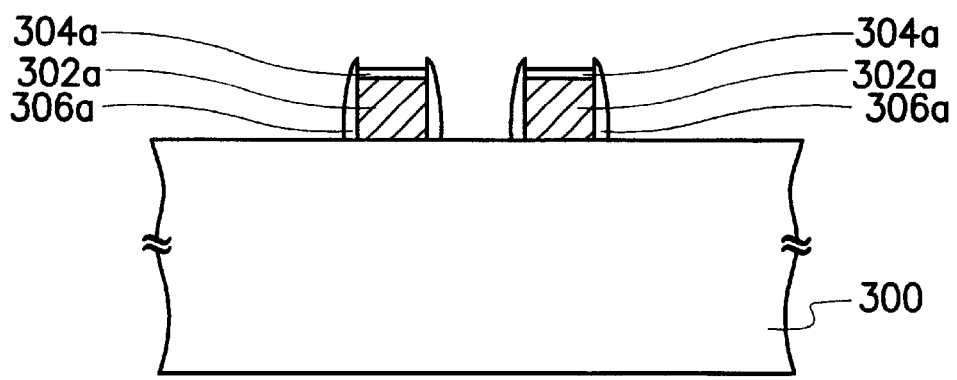

Referring to FIG. 6, after the spacer 306 is formed, the sacrificed oxide layer 305a is removed, the etching is carried out with the etchant which has higher etching selectivity for the dielectric layer to silicon nitride, such that the spacer 306 protrudes in the form of, horn. Subsequently, a dielectric layer 308 having a flat upper surface is formed over the substrate 300. The material used for the dielectric layer 308 is the material such as silicon dioxide. The sacrificed oxide layer 305a can be removed by dry etching or wet etching.

Figure 7:
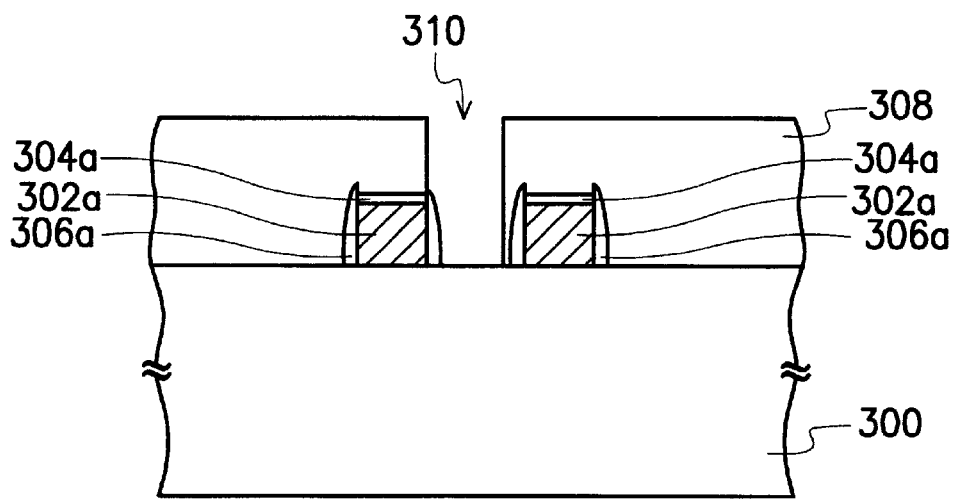

Referring to FIG. 7, a contact hole 310 is formed by performing a method of lithography and etching on the dielectric layer 308 to expose the substrate 300. Etchants used in the method of etching can be preferably selected from materials with a higher selectivity for the dielectric layer 308 to silicon nitride.

Figure 8:
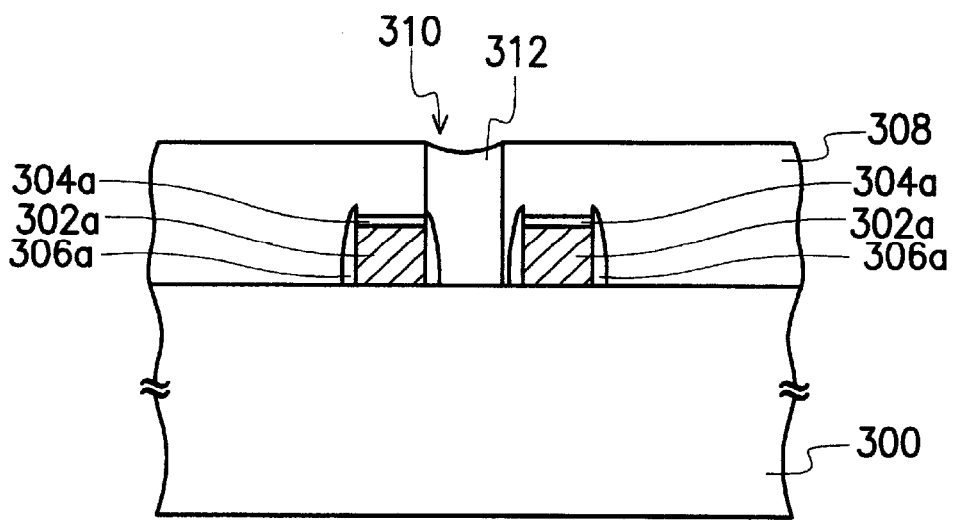

Referring to FIG. 8, after the contact hole 310 is formed, a conductive material is applied over the structure and filled into the contact hole 310. The conductive material over the dielectric layer 308 and the contact hole 310 is then removed to form a conductive plug 312 in the contact hole 310. The removal of the conductive material is achieved by a method such as etching back or chemical mechanical polishing (CMP).

As mentioned above, the characteristics of the present invention are that the spacer is pulled up by the stack structure of a conductor line layer, an etching stop layer and a sacrificed oxide layer, then a protruding portion 306a on a top corner of the spacer 306 is formed to make the space 306 become horn-like in a cross-sectional view by means of removing the sacrificed oxide layer. Then, a dielectric layer is deposited over the stack structure. A contact hole is defined An etchant having higher etching selectivity for the dielectric layer to silicon nitride is used to remove the dielectric layer at the contact hole, forming the contact hole to connect the substrate. During forming the contact hole by removing a part of the dielectric layer, because the etchant having higher etching selectivity for the dielectric layer to silicon nitride is used, the tip of the horn-shaped silicon nitride spacer is etched less. The distance between the conductor lines and the plug can be ensured. Further, the problem of spacer being thinner during etching in the prior art will be eliminated, because the tip of the spacer can not be etched off readily. Therefore, the dielectric layer in which the bottom of the contact hole will contact the substrate can be etched more completely, preventing the contact area from being decreased and contact resistance from being increased.

Many changes and modifications in the above described embodiment of the present invention can, of course, be carried out without apart from the scope thereof. Accordingly, to promote the progress in science and the useful art, the invention is disclosed and is intended to be limited only by the appended claims.

What is claimed is:

1. A method of fabricating a self-aligned contact, comprising:

providing a substrate;

sequentially forming a conductive layer, an etching stop layer and a sacrificed oxide layer on the substrate;

forming a patterned photoresist layer on the sacrificed oxide layer;

forming a stack structure by performing a process of anisotropic etching sequentially on the exposed sacrificed oxide layer, the etching stop layer, and the conductive layer;

removing the photoresist layer;

forming a spacer on a sidewall of the stack structure;

removing the etched sacrificed oxide layer, such that the spacer protrudes above an upper surface of the etching stop layer;

forming a dielectric layer on the substrate and said stack structure, wherein the dielectric layer has a flat upper surface;

removing a part of the dielectric layer to form a contact hole which exposes a part of said substrate; and forming a conductive plug in the contact hole.

2. The method of fabricating a self-aligned contact according to claim 1, wherein the material for said conductive layer is metal or polycrystal tungsten silicide.

3. The method of fabricating a self-aligned contact according to claim 1, wherein the step of forming the etching stop layer is by a method of LP-CVD, PE-CVD or HDP-CVD.

4. The method of fabricating a self-aligned contact according to claim 1, wherein the etching stop layer is made of silicon nitride.

5. The method of fabricating a self-aligned contact according to claim 1, wherein the step of forming the sacrificed oxide layer is by a method of LP-CVD or PE-CVD.

6. The method of fabricating a self-aligned contact according to claim 1, wherein the sacrificed oxide layer is silicon dioxide of TEOS.

7. The method of fabricating a self-aligned contact according to claim 1, wherein the step of removing the sacrificed oxide layer is carried out with etchants having higher etching selectivity for the sacrificed oxide layer to silicon nitride.

8. The method of fabricating a self-aligned contact according to claim 1, wherein the step of forming the spacer is by a method of LP-CVD or HCP-CVD.

9. The method of fabricating a self-aligned contact according to claim 1, wherein the etching for removal of said sacrificed oxide layer includes dry etching and wet etching.

10. The method of fabricating a self-aligned contact according to claim 1, wherein step of removing the dielectric layer is carried out with etchants having a higher etching selectivity for said dielectric layer to silicon nitride.

11. A method of fabricating a self-aligned contact, comprising:
   providing a substrate having a stack structure of the conductor lines formed by stacking in turns a conductive layer, an etching stop layer and a sacrificed oxide layer thereon;
   forming a spacer on a sidewall of the stack structure;
   removing the sacrificed oxide layer, such that the spacer protrudes above an upper surface of the etching stop layer;
   forming a dielectric layer having a flat upper surface over said substrate and said stack structure;
   defining said dielectric layer to form a contact hole to connect said substrate;
   forming a conductive layer on said dielectric layer and fill said contact hole; and
   etching back said conduct material, and forming a conductive plug in said contact hole.

12. The method of fabricating a self-aligned contact according to claim 11, wherein the material for said conductive layer is metal or polycrystal tungsten silicide.

13. The method of fabricating a self-aligned contact according to claim 11, wherein the step of forming said etching stop layer is by a method of LP-CVD, PE-CVD or HDP-CVD.

14. The method of fabricating a self-aligned contact according to claim 11, wherein said etching stop layer is made of silicon nitride.

15. The method of fabricating a self-aligned contact according to claim 11, wherein the step of forming said sacrificed oxide layer is by a method of LP-CVD or PE-CVD.

16. The method of fabricating a self-aligned contact according to claim 11, wherein the said sacrificed oxide layer is made of silicon dioxide of TEOS.

17. The method of fabricating a self-aligned contact according to claim 11, wherein the step of removing said sacrificed oxide layer is carried out with etchants having higher etching selectivity for said sacrificed oxide layer to silicon nitride.

18. The method of fabricating a self-aligned contact according to claim 11, wherein the step of forming said spacer includes performing a method of LP-CVD and HDP-CVD.

19. The method of fabricating a self-aligned contact according to claim 11, wherein the step of removing said sacrificed oxide layer includes a method of dry etching or wet etching.

20. The method of fabricating a self-aligned contact according to claim 11, wherein the step of defining said dielectric layer is carried out with etchants having higher etching selectivity for said dielectric layer to silicon nitride.

* * * * *